US006909609B1

(12) United States Patent
Chen

(10) Patent No.: US 6,909,609 B1
(45) Date of Patent: Jun. 21, 2005

(54) RACK-MOUNTED CONTROLLER

(75) Inventor: Kevin Chen, Shijr (TW)

(73) Assignee: Aten International Co., Ltd., Taipei (TW)

( * ) Notice: Subject to any disclaimer, the term of this patent is extended or adjusted under 35 U.S.C. 154(b) by 0 days.

(21) Appl. No.: 10/815,859

(22) Filed: Apr. 2, 2004

(51) Int. Cl.[7] .................................................. H05K 5/00
(52) U.S. Cl. .................................................... 361/724
(58) Field of Search ........................... 361/679–687, 361/724–727, 829–832

(56) References Cited

U.S. PATENT DOCUMENTS 6,741,463 B1 * 5/2004 Akhtar et al. ............... 361/686

2003/0193781 A1 * 10/2003 Mori ........................... 361/725
2004/0188362 A1 * 9/2004 Liu et al. ....................... 211/26

* cited by examiner

Primary Examiner—Lynn Feild
Assistant Examiner—Zachary M Pape
(74) Attorney, Agent, or Firm—Troxell Law Office, PLLC

(57) ABSTRACT

A rack-mounted controller includes separated main body and control panel electrically connected to one another via a connecting cable, which serves as a path for sending signals between the main body and the control panel. The control panel and the main body are fixed to a front and a rear end, respectively, of a rack for, for example, computer-related apparatus, so that an operator may conveniently observe and operate pushbuttons on the front side of the control panel and has easy access to sockets provided on the rear side of the main body for convenient connection of the controller to external apparatus via the sockets.

4 Claims, 7 Drawing Sheets

RACK-MOUNTED CONTROLLER

FIELD OF THE INVENTION

The present invention relates to a rack-mounted controller, and more particularly to a rack-mounted controller having separated main body and control panel, which are fixed to a front and a rear end, respectively, of a rack to enable easy control of pushbuttons on a front side of the control panel and easy access to sockets at a rear side of the main body for connection of the controller to external apparatus.

BACKGROUND OF THE INVENTION

With the extremely high development in the information industry, people need more computer-related apparatus to process data over information networks. For instance, there are a lot of hosts, hubs, and various kinds of controllers set up in the machine room of a network service provider and the information office of a business organization. These computer-related apparatus are normally orderly mounted on a rack to of signal cables and power cords among different apparatus, as well as convenient observation of the use condition of various apparatus.

FIG. 1 shows a currently frequently employed controller 10 that has a relatively small volume and usually a longitudinal length much shorter than that of other apparatus. When the controller 10 is fixed to a rack 11 as shown in FIG. 1, a control panel 13 at a front side of the controller 10 is located close to a front end of the rack 11 and can be conveniently operated and observed by an operator. However, sockets (not shown) provided at a rear side of the controller 10 are located in the rack 11 with some distance from a rear end of the rack 11, causing inconvenience in connecting the controller to other external apparatus via the sockets.

SUMMARY OF THE INVENTION

A primary object of the present invention is to provide a rack-mounted controller that includes separated main body and control panel, so that the control panel and the main body are fixed to a front and a rear end, respectively, of a rack for, for example, computer-related apparatus, enabling an operator to conveniently observe and operate pushbuttons on a front side of the control panel and have easy access to a rear side of the main body for convenient connection of the controller to external apparatus.

To achieve the above and other objects, the rack-mounted controller of the present invention mainly includes a main body, a control panel separated from the main body, and a connecting cable. The main body is internally provided with a switching circuit, and externally provided at a rear side with sockets for connecting to external apparatus. The control panel is provided at a front side with pushbuttons. The connecting cable electrically connects the main body to the control panel to enable signal transmission between the main body and the control panel. The control panel is fixed to a front end of a rack and the main body to a rear end of the rack, enabling an operator to easily access the pushbuttons on the front side of the control panel and the sockets on the rear side of the main body.

In the present invention, the rack-mounted controller has a length extended in a longitudinal direction between the front and the rear end of the rack is smaller than an overall distance between the front and the rear end of the rack.

In the rack-mounted controller of the present invention, the control panel is provided with a microprocessor that communicates with another microprocessor in the main body via a set of duplex serial signals, so that the connecting cable may have decreased number of strands to reduce noise interference.

The connecting cable for the rack-mounted controller of the present invention is preferably spirally formed to provide good extensibility.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
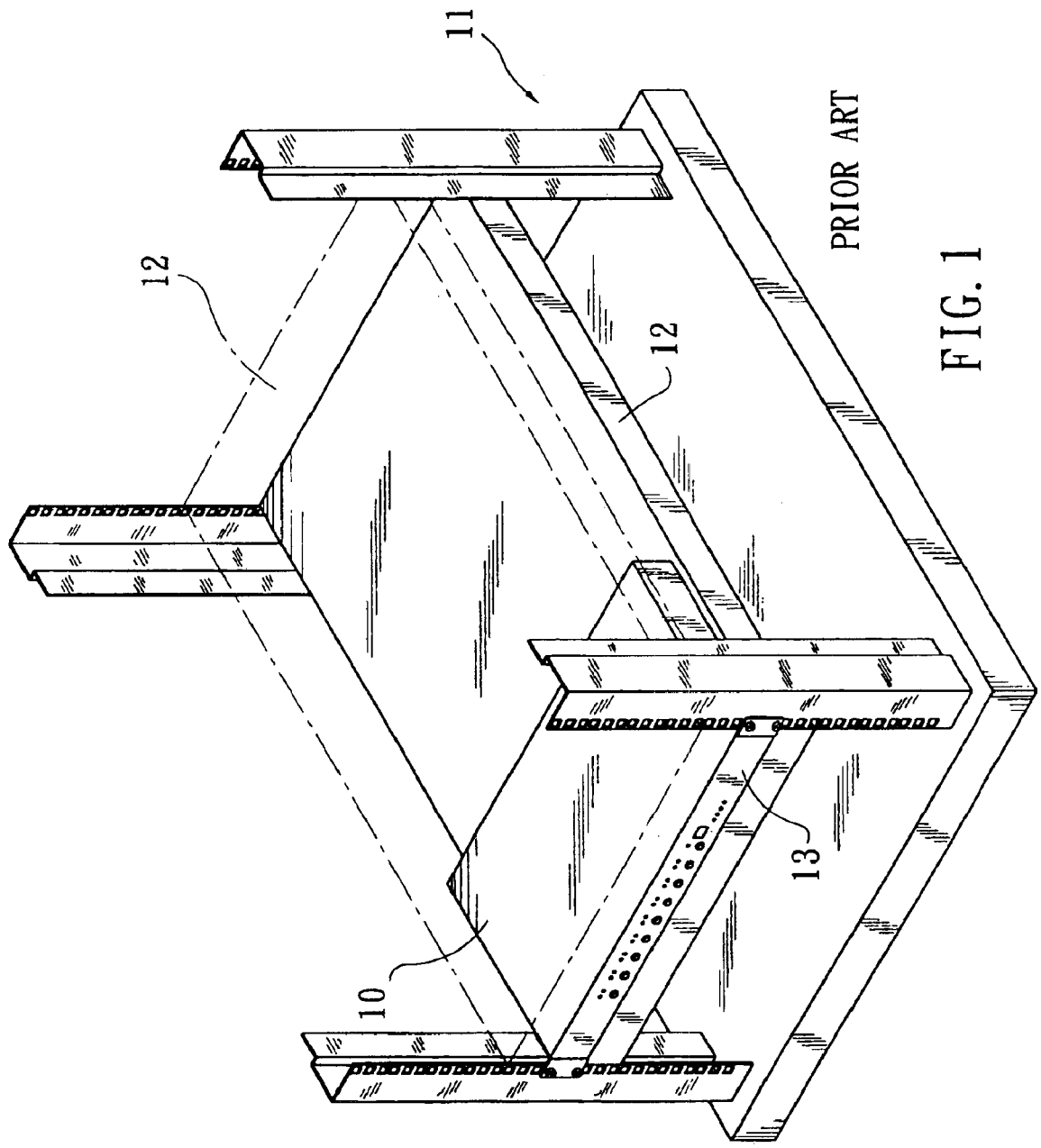
FIG. 1 shows a conventional controller fixed to a rack for computer-related apparatus.
Figure 2:
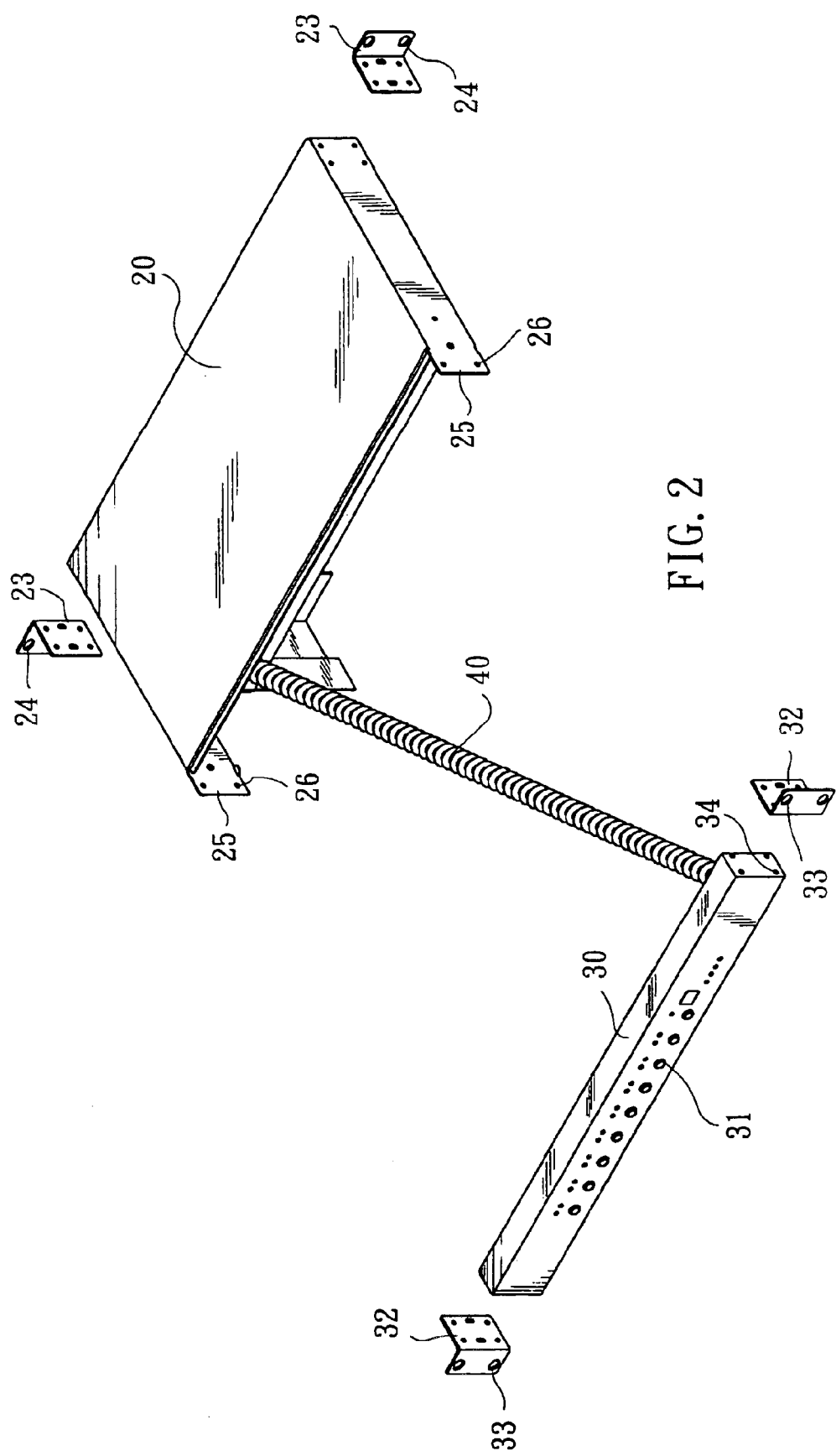
FIG. 2 is a perspective view of a rack-mounted controller according to the present invention.
Figure 3:
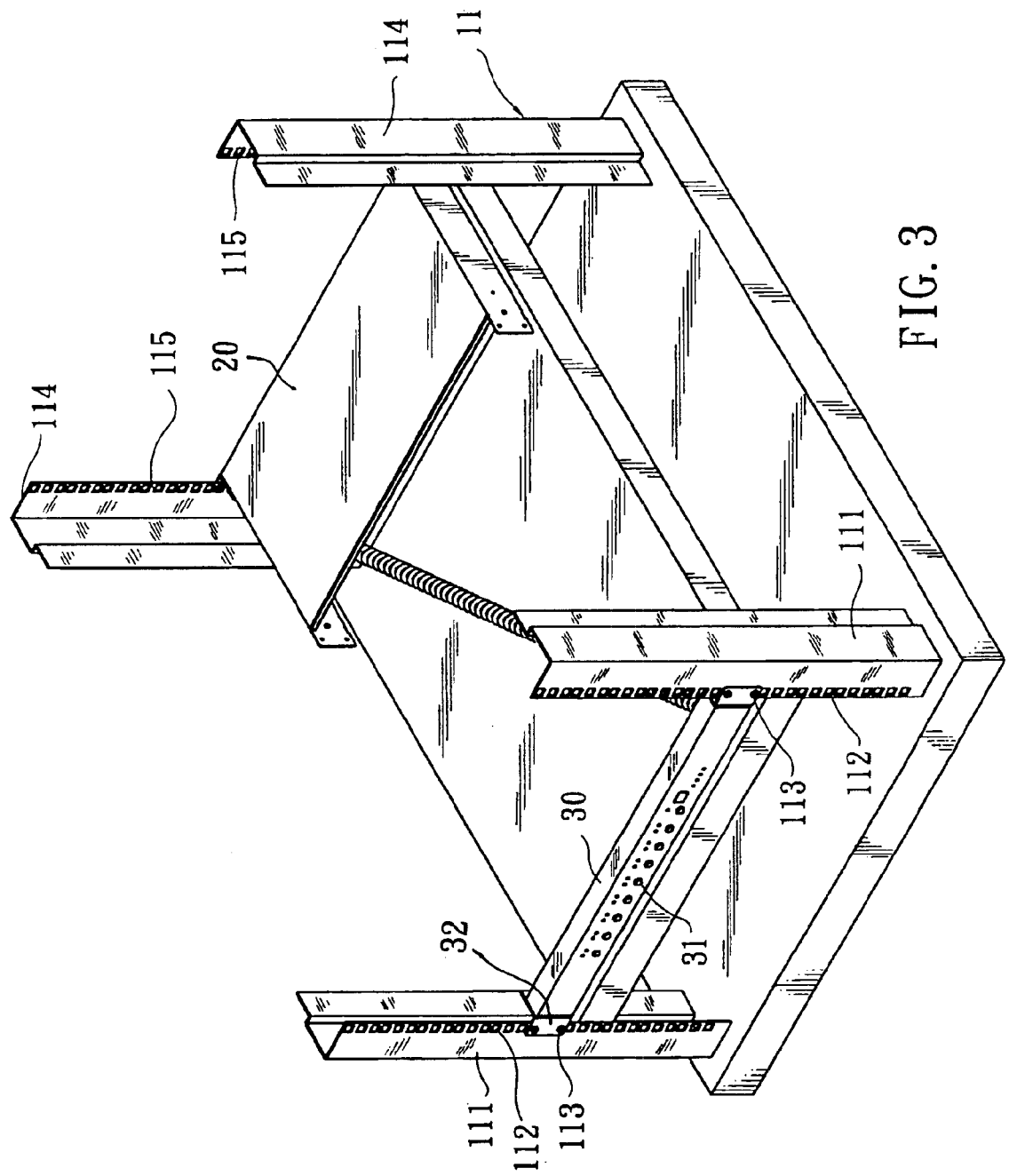
FIG. 3 shows the rack-mounted controller of FIG. 2 is fixed to a rack for computer-related apparatus.

Please refer to FIG. 2 that is a perspective view of a rack-mounted controller according to the present invention. As shown, the controller mainly includes a main body 20, a control panel 30, and a connecting cable 40. FIG. 3 shows the rack-mounted controller of the present invention is fixed to a rack for computer-related apparatus 11, which includes two front posts 111 and two rear posts 114 that form a front and a rear end, respectively, of the rack 11. As can be clearly seen from FIGS. 3 and 4, the main body 20 of the controller is fixed to the rear end of the rack 11, and is internally provided with a control circuit (not shown). At least two sockets 21, 22 are externally provided at a rear side of the main body 20 to expose from and be accessed via the rear end of the rack 11 for connecting to at least two external apparatus 50.

The control panel 30 is fixed to the front end of the rack 11, and is provided at a front side with at least one pushbutton 31, which is exposed from and accessible via the front end of the rack 11.

The connecting cable 40 is extended between the main body 20 and the control panel 30 to electrically connect the two parts to one another.

A length of the main body 20 of the controller extended in a longitudinal direction between the front and the rear end of the rack 11 is smaller than a distance between the front and the rear end of the rack 11. And, the at least one pushbutton 31 on the control panel 30 is adapted to control signal transmission between the main body 20 and at least one of the external apparatus 50 connected to the main body 20.

The rack-mounted controller of the present invention may be a power supply controller, or a signal-switching controller. Since the control circuit in the controller is a known art and not a feature to be claimed in the present invention, it is not discussed herein.

Please refer to FIGS. 2 and 3 at the same time. Two L-shaped brackets 32 are separately fixedly connected to two lateral ends of the control panel 30. Through holes 33 are formed on the L-shaped brackets 32 to correspond to mounting holes 112 provided on the front posts 111 of the rack 11. Therefore, the control panel 30 may be fixedly connected to the front end of the rack 11 by threading fastening means, such as screws 113, through aligned mounting holes 112 and through holes 33. An operator may therefore conveniently operate, control, and observe pushbuttons 31 on the control panel 30 that is located close to the front end of the rack 11.

Figure 4:
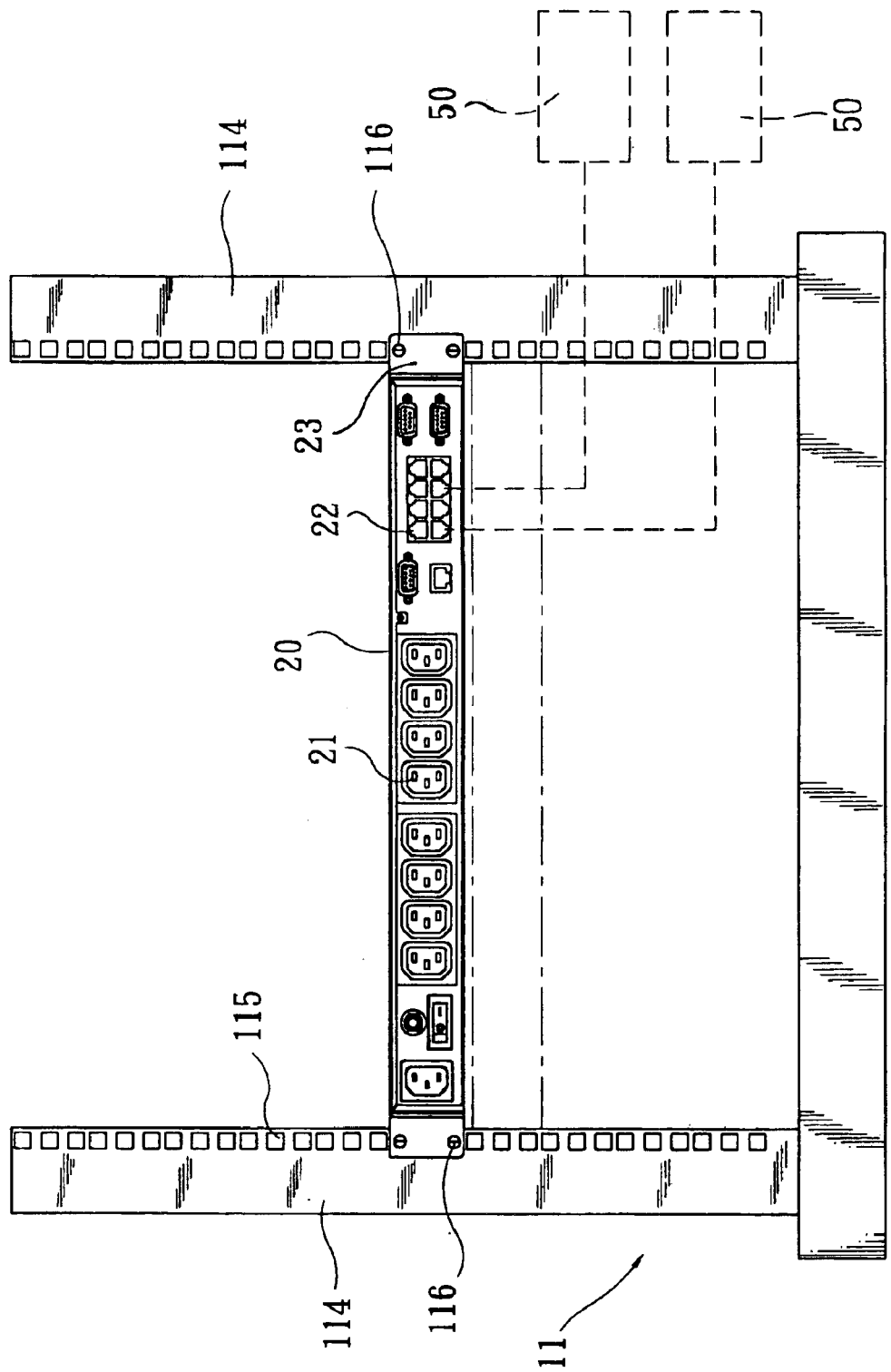
FIG. 4 is a rear plan view of FIG. 3.

Please refer to FIGS. 2, 3, and 4 at the same time. There are also two L-shaped brackets 23 fixedly connected to two rear outer ends of the main body 20 of the rack-mounted controller. Through holes 24 are formed on the L-shaped brackets 23 to correspond to mounting holes 115 provided on the rear posts 114 of the rack 11. Therefore, the main body 20 may be fixedly connected to the rear end of the rack 11 by threading fastening means, such as screws 116, through aligned mounting holes 115 and through holes 24. In this manner, sockets 21, 22 provided on the rear side of the main body 20 are locate in the vicinity of the rear end of the rack 11 and can be easily accessed by an operator for wire connecting purpose.

The connecting cable 40 serves as a path for sending signals of switching circuits between the control panel 30 and the main body 20. The connecting cable 40 is preferably a spiral cable to provide good extensibility.

Figure 7:
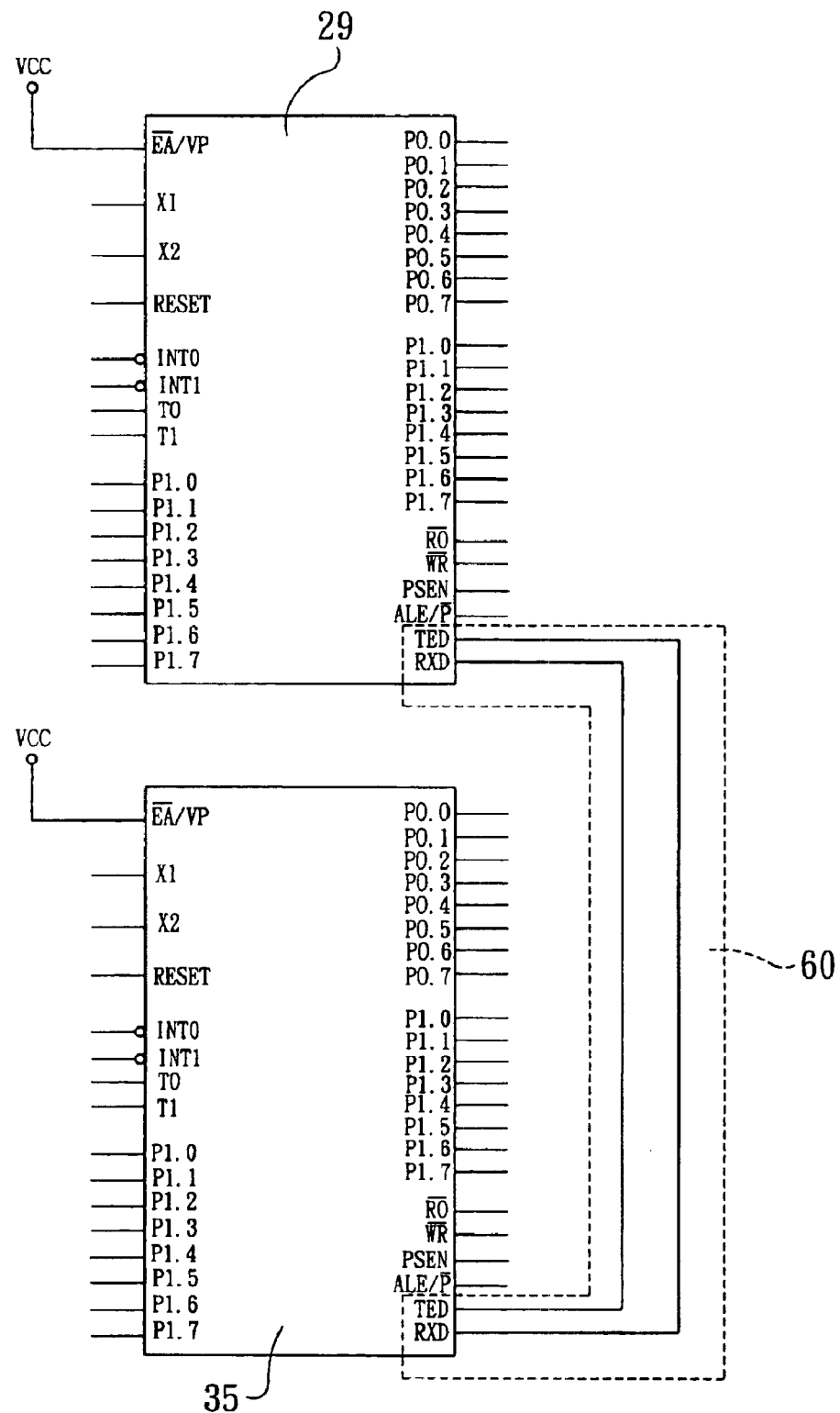
FIG. 7 is a circuit diagram for the rack-mounted controller of the present invention showing the path for sending signals between a microprocessor on the control panel and another microprocessor on the main body.

As can be seen from FIG. 7 that is a circuit diagram of the present invention, the control panel 30 includes a microprocessor 35, which communicates with another microprocessor 29 in the main body 20 via a set of duplex serial signals 60. Therefore, in addition to lines for power supply and reset, the connecting cable 40 also includes two lines for sending the set of duplex serial signals 60. In this manner, the number of strands in the connecting cable 40 may be decreased to reduce noise interference.

Figure 5:
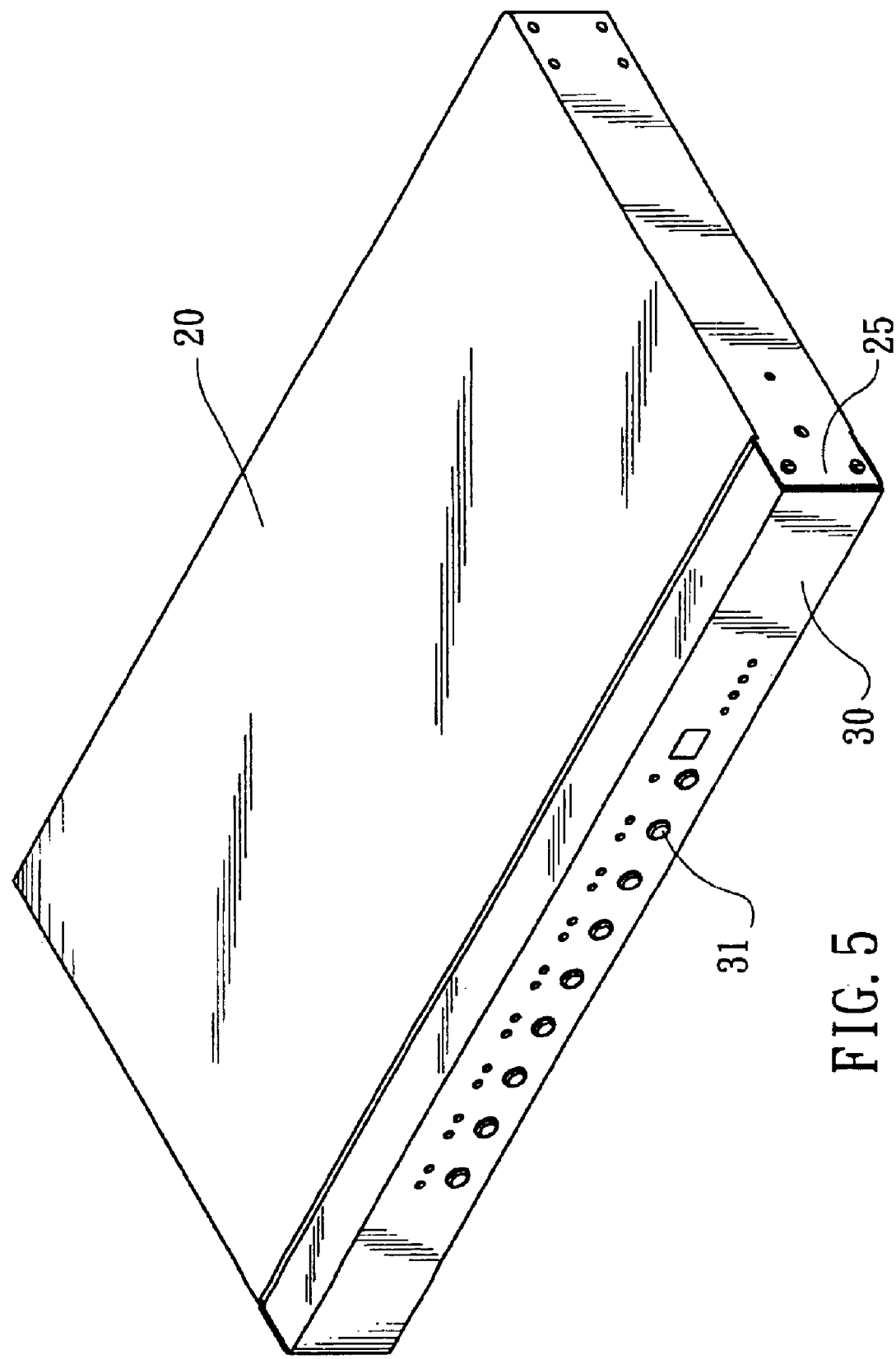
FIG. 5 is a perspective view of the rack-mounted controller of the present invention with a control panel and a main body thereof locked into one unit.

In actual manufacture of the rack-mounted controller of the present invention, the main body 20 is made to have two lateral sides that forward extend from a front edge of the main body 20 by a predetermined length so as to provide two projected plates 25. The length by which the plates 25 project from the front edge of the main body 20 is equal to a thickness of the control panel 30 in the longitudinal direction of the rack 11, such that the control panel 30 with the two L-shaped brackets 32 dismounted therefrom may be fitly transversely located between the two projected plates 25. The control panel 30 located between the two projected plates 25 may be further locked to the main body 20 by threading fastening means through connecting holes 26 on the projected plates 25 into connecting holes 34, which are provided at the lateral ends of the control panel 30 also for connecting the L-shaped brackets 32 thereto, as shown in FIG. 5. With the control panel 30 locked to the main body 20, the rack-mounted controller of the present invention may be conveniently transported and/or stored.

Figure 6:
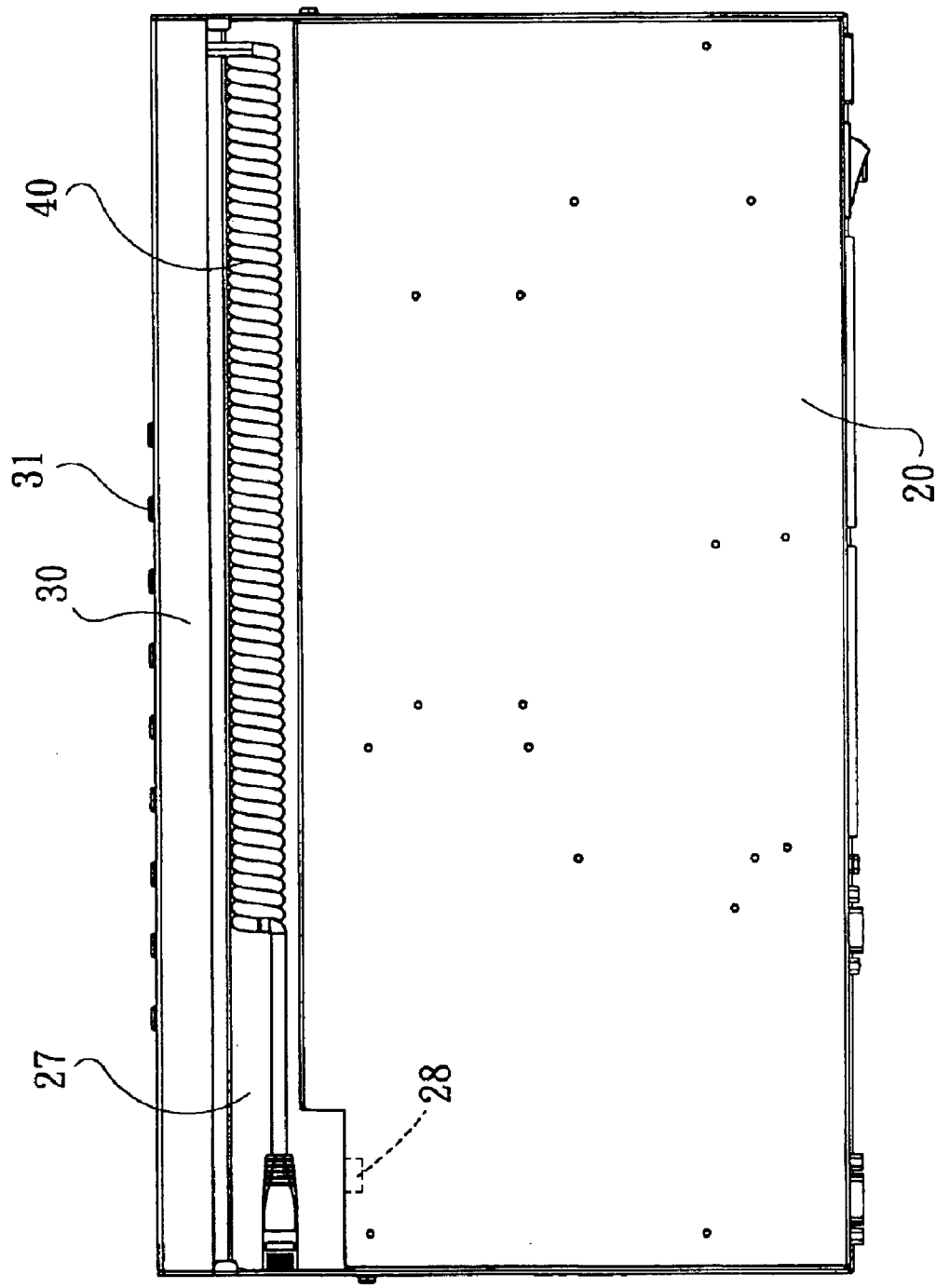
FIG. 6 is a bottom plan view of FIG. 5.

When the main body 20 and the control panel 30 are in the locked state, the connecting cable 40 is invisibly received in a void 27 existed between the main body 20 and the control panel 30, as shown in FIG. 6. The connecting cable 40 received in the void 27 is unplugged from a corresponding jack 28 provided on the main body 20.

In brief, the rack-mounted controller of the present invention includes separated main body and control panel, so that the controller may be fixed to a rack for computer-related apparatus with the control panel and the main body separately located close to the front and the rear end, respectively, of the rack, enabling an operator to conveniently access the sockets at the rear side of the main body exposed from the rear end of the rack to easily connect external apparatus to the main body of the controller and/or examine such connection.

What is claimed is:

1. A rack-mounted controller for mounting on a rack for example, a computer-related apparatus, comprising:

a main body fixed to a rear end of said rack and including a control circuit provided in said main body and at least two sockets provided at a rear side of said main body to expose from the rear end of said rack for connecting to at least two external apparatus;

a control panel fixed to a front end of said rack and including at least one pushbutton provided at a front side of said control panel being expose from the front end of said rack; and a connecting cable extended between said main body and said control panel for electrically connecting said main body to said control panel;

wherein a length of said main body extended in a longitudinal direction between the front and the rear end of said rack is smaller than an overall distance between the front and the rear end of said rack, and said at least one pushbutton provided on said control panel is adapted to control signal transmission between said main body and any one of said at least two external apparatus connected to said main body.

2. The rack-mounted controller as claimed in claim 1, wherein said control panel is provided with a microprocessor, which communicates with another microprocessor provided in said main body of said controller via a set of duplex serial signals.

3. The rack-mounted controller as claimed in claim 1, wherein said connecting cable is spirally formed to provide a predetermined extensibility.

4. The rack-mounted controller as claimed in claim 1, wherein said main body has two lateral sides forward extended from a front edge of said main body to provide two projected plates, and said control panel before fixing to the front end of said rack being adapted to traverse between and fasten to said two projected plates and thereby be locked to said main body with said connecting cable invisibly received in a void extending between said control panel and said main body when said plates are locked together.

* * * * *